(12) United States Patent
Eid et al.

(10) Patent No.: US 11,652,074 B2
(45) Date of Patent: May 16, 2023

(54) SEMICONDUCTOR PACKAGE WITH IMPROVED THERMAL BLOCKS

(71) Applicant: INTEL CORPORATION, Santa Clara, CA (US)

(72) Inventors: Feras Eid, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 16/639,049

(22) PCT Filed: Sep. 29, 2017

(86) PCT No.: PCT/US2017/054584
§ 371 (c)(1),
(2) Date: Feb. 13, 2020

(87) PCT Pub. No.: WO2019/066957
PCT Pub. Date: Apr. 4, 2019

(65) Prior Publication Data
US 2020/0203298 A1  Jun. 25, 2020

(51) Int. Cl.
*G11C 5/06* (2006.01)
*H01L 27/108* (2006.01)
(Continued)

(52) U.S. Cl.
CPC ........ *H01L 24/14* (2013.01); *H01L 23/49816* (2013.01); *H01L 23/53228* (2013.01); *H01L 25/0655* (2013.01); *H01L 2224/12105* (2013.01)

(58) Field of Classification Search
CPC .............. H01L 24/14; H01L 23/49816; H01L 23/53228; H01L 25/0655;
(Continued)

(56) References Cited

U.S. PATENT DOCUMENTS 6,156,980 A * 12/2000 Peugh ................. H01L 23/3677
174/262
6,252,178 B1 * 6/2001 Hashemi ................. H01L 24/05
174/262
(Continued)

OTHER PUBLICATIONS

International Search Report and Written Opinion for International Patent Application No. PCT/US2017/054584 dated Jun. 29, 2018, 11 pgs.
(Continued)

*Primary Examiner* — Brigitte A Paterson
*Assistant Examiner* — Tenley H Schofield
(74) *Attorney, Agent, or Firm* — Essential Patents Group, LLP.

(57) ABSTRACT

An apparatus is provided which comprises: a first set of one or more metal pads on a first substrate surface, the first set of one or more metal pads to couple with contacts of an integrated circuit die, a second set of one or more metal pads on the first substrate surface, the second set of one or more metal pads to couple with semiconductor surfaces of the integrated circuit die, one or more thermal regions below the first substrate surface, wherein the one or more thermal regions comprise thermally conductive material and are coupled with the second set of one or more metal pads, dielectric material adjacent the one or more thermal regions, and one or more conductive contacts on a second substrate surface, opposite the first substrate surface, the one or more conductive contacts coupled with the first set of one or more metal pads, and the one or more conductive contacts to couple with contacts of a printed circuit board. Other embodiments are also disclosed and claimed.

22 Claims, 7 Drawing Sheets

(51) Int. Cl.
*H01L 21/02* (2006.01)
*H01L 21/56* (2006.01)
*H01L 21/762* (2006.01)
*H01L 23/31* (2006.01)
*H01L 23/00* (2006.01)
*H01L 23/498* (2006.01)
*H01L 29/417* (2006.01)
*H01L 29/66* (2006.01)
*H01L 29/78* (2006.01)
*H01L 21/768* (2006.01)
*H01L 29/40* (2006.01)
*H01L 21/285* (2006.01)
*H01L 29/49* (2006.01)
*H01L 23/532* (2006.01)
*H01L 25/065* (2023.01)

(58) Field of Classification Search
CPC . H01L 2224/12105; H01L 23/42–4338; H01L 23/373–3738; H01L 2224/06519; H01L 2224/09519; H01L 2224/14519; H01L 2224/17519; H01L 2224/30519
See application file for complete search history.

(56) References Cited

U.S. PATENT DOCUMENTS

| | | | |
|---|---|---|---|
| 6,448,639 B1 * | 9/2002 | Ma | H01L 23/49838 257/691 |
| 7,018,216 B1 * | 3/2006 | Clark | H01R 13/6592 439/63 |
| 7,494,843 B1 | 2/2009 | Lin et al. | |
| 9,196,575 B1 * | 11/2015 | Lee | H01L 23/3675 |
| 10,340,199 B2 * | 7/2019 | Hsu | H01L 23/3677 |
| 2002/0008963 A1 * | 1/2002 | DiBene, II | G06F 1/189 361/720 |
| 2007/0166554 A1 * | 7/2007 | Ruchert | H01L 23/3737 428/446 |
| 2009/0127707 A1 * | 5/2009 | Sato | H01L 25/0657 257/737 |
| 2009/0179323 A1 * | 7/2009 | Feng | H01L 23/3677 438/122 |
| 2009/0236749 A1 * | 9/2009 | Otremba | H01L 24/82 257/774 |
| 2009/0302445 A1 | 12/2009 | Pagaila et al. | |
| 2010/0213601 A1 * | 8/2010 | Smeys | H01L 24/97 257/713 |
| 2012/0286408 A1 * | 11/2012 | Warren | H01L 24/19 257/673 |
| 2015/0162307 A1 | 6/2015 | Chen | |
| 2016/0133542 A1 * | 5/2016 | Cha | H01L 23/3677 257/691 |
| 2016/0233139 A1 * | 8/2016 | Gandhi | H01L 25/50 |
| 2018/0218962 A1 * | 8/2018 | Geissler | H01L 25/074 |
| 2018/0356538 A1 * | 12/2018 | Deych | G01T 1/2006 |

OTHER PUBLICATIONS

International Preliminary Report on Patentability for PCT Application No. PCT/US17/54584, dated Apr. 9, 2020.

* cited by examiner

SEMICONDUCTOR PACKAGE WITH IMPROVED THERMAL BLOCKS

CLAIM OF PRIORITY

This Application is a National Stage Entry of, and claims priority to, PCT Application No. PCT/US17/54584, filed on Sep. 29, 2017 and titled "PACKAGE WITH IMPROVED THERMALS", which is incorporated by reference in its entirety for all purposes.

BACKGROUND

In modern communication systems, components with high power density, such as power amplifiers and monolithic microwave integrated circuits (MMICs), are often needed. These components can have power densities which may be one or two orders of magnitude greater than a typical CMOS device. Often the power is localized to a handful of regions within these high power density components.

Some efforts at thermal management for high power density devices have included wirebonded packages with exposed thermal pads adjacent one surface of the device to spread heat and signal routing with wirebonds from an opposite surface of the device. While these solutions may provide effective thermal management, their relatively large form factor may not be feasible for use in thin form factor systems.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
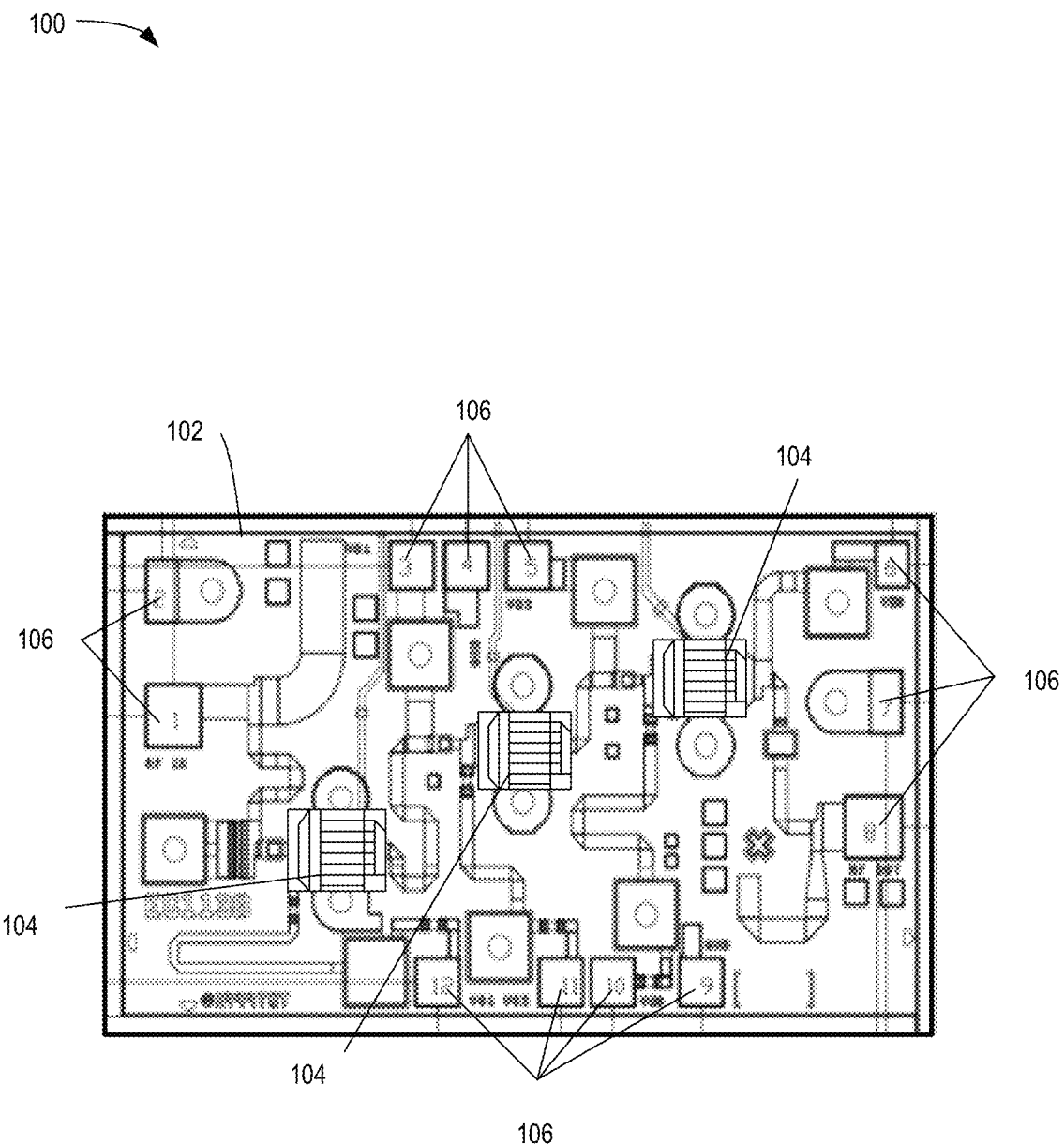
FIG. 1 illustrates a plan view of an example semiconductor device, according to some embodiments.

A package with improved thermals is generally presented. In this regard, embodiments of the present disclosure enable a chip scale package with embedded heat spreading and routing. Thermally conductive material may be placed in contact with particularly high power density regions of a die and routed to a board interface. One skilled in the art would appreciate that this approach may enable a more compact package form factor by eliminating wirebonds.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicates that different instances of like objects are being referred to, and is not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a plan view of an example semiconductor device, according to some embodiments. As shown, device 100 includes surface 102, transistor regions 104, and contact pads 106. In some embodiments, device 100 may be a power amplifier or MMIC. Device 100 may have a length and width of up to about eight millimeters by up to about eight millimeters.

In some embodiments, transistor regions 104 represent regions of high electron mobility transistors (HEMTs) or other high speed circuits. In some embodiments, the power density of transistor regions 104 may be several thousands of watts per square centimeter. The power density of transistor regions 104 may represent hot spot regions where a significant amount of heat is generated that needs to be effectively dissipated. While shown as being located relatively centrally on surface 102, transistor regions 104 may alternatively or also be located near a periphery of surface 102.

Contact pads 106 may represent conductive contacts, such as solder pads, microbumps, etc. to route input/output signals, power, ground, etc. to and from device 100. In some embodiments, contact pads 106 are designed to couple with pads of a package substrate. While shown as being located relatively peripherally on surface 102, contact pads 106 may alternatively or also be located relatively centrally on surface 102.

Figure 2A:
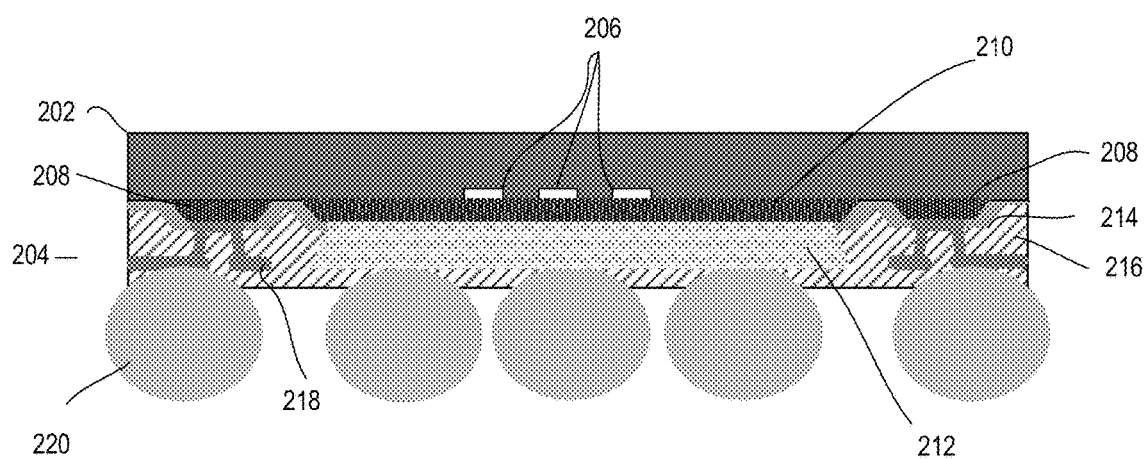
FIGS. 2A & 2B illustrate cross-sectional views of packages with improved thermals, according to some embodiments.
Figure 2B:
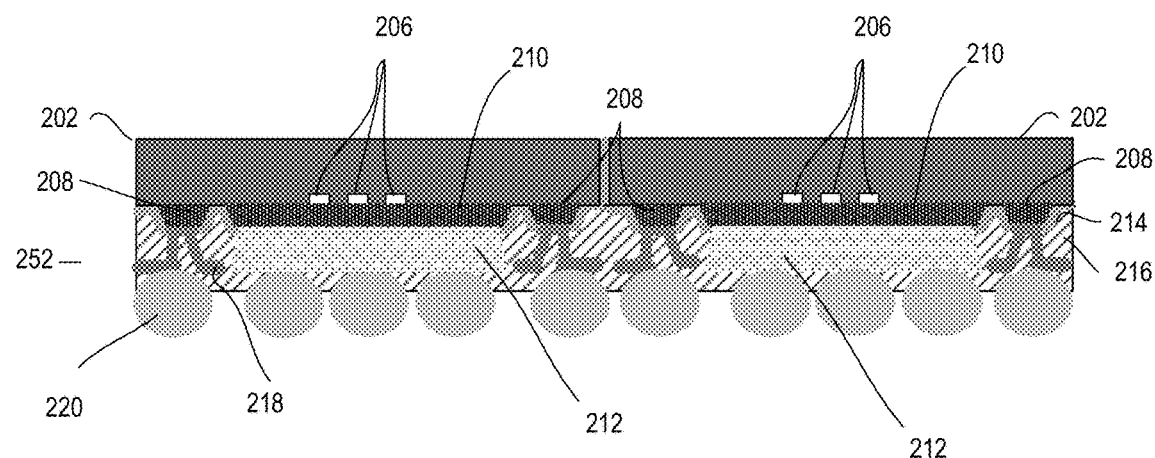

FIGS. 2A & 2B illustrate cross-sectional views of packages with improved thermals, according to some embodiments. As shown in FIG. 2A, package 200 includes die 202, package substrate 204, hot spot areas 206, electrical metal pads 208, thermal metal pad 210, thermal region 212, passivation material 214, dielectric 216, metal routing 218, and conductive contacts 220. In some embodiments, package 200 may represent a chip scale package built up on die 202, in which package substrate 204 represents redistribution layers formed on the die, while in other embodiments, package substrate 204 may be formed separate from die 202

Die 202 may include aspects of device 100 previously mentioned, including transistor regions 104 and contact pads 106 on a surface 102. As such, hot spot areas 206 may correspond to transistor regions 104 where there may be particularly high power density regions when die 202 is active.

Package substrate 204 may include electrical metal pads 208 and thermal metal pad 210 in contact with die 202. In some embodiments, electrical metal pads 208 may couple with contact pads (not shown) on die 202 to route input/output signals as well as power and ground signals. Thermal metal pad 210 may contact a portion of die 202 including hot spot areas 206 to conduct and spread heat away from die 202. In some embodiments, electrical metal pads 208 and thermal metal pad 210 are copper, however in other embodiments, other metals, including but not limited to aluminum, silver, gold or nickel may be used. Electrical metal pads 208 and thermal metal pad 210 may be the same or different metals.

In some embodiments, package substrate 204 includes thermal region 212 in contact with thermal metal pad 210 to further conduct and spread heat away from die 202. In some embodiments, thermal region 212 is a metal, either the same as, or different from, thermal metal pad 210. In other embodiments, thermal region 212 is a thermally conductive paste, such as a metal filled silicone or epoxy paste, that may be more easily formed at greater thicknesses compared to metal plating.

In some embodiments, package substrate 204 includes passivation material 214, which may include an organic or inorganic dielectric material, for example, to adhere to and protect die 202 and metal pads 208 and 210. Dielectric 216, which may include silicon dioxide or other inorganic or organic dielectrics (such as a polymer), may be built up iteratively with metal routing 218 to conductively couple electrical metal pads 208 with conductive contacts 220 on an opposite surface of package substrate 204. Conductive contacts 220 may include solder balls or any other known contacts, such as pins, lands, etc.

FIG. 2B shows package 250, which may include aspects of package 200 previously mentioned. As shown, package 250 may include two dies 202 coupled with package substrate 252. Package substrate 252 may include separate thermal metal pads 210 and thermal regions 212 to thermally conduct heat from each die 202. While shown as coupling with two analogous devices, in some embodiments package substrate 252 may be designed to couple with any number of different devices, perhaps with different thermal management needs.

Figure 3A:
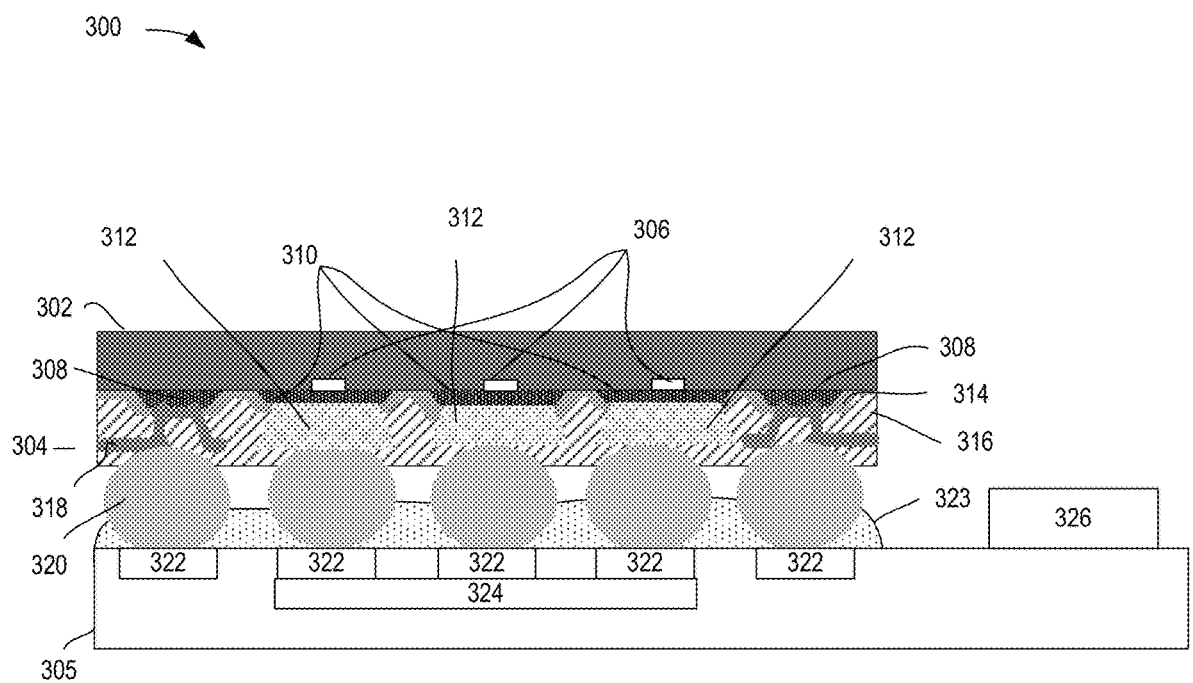
FIGS. 3A & 3B illustrates cross-sectional views of systems including a package with improved thermals, according to some embodiments.
Figure 3B:
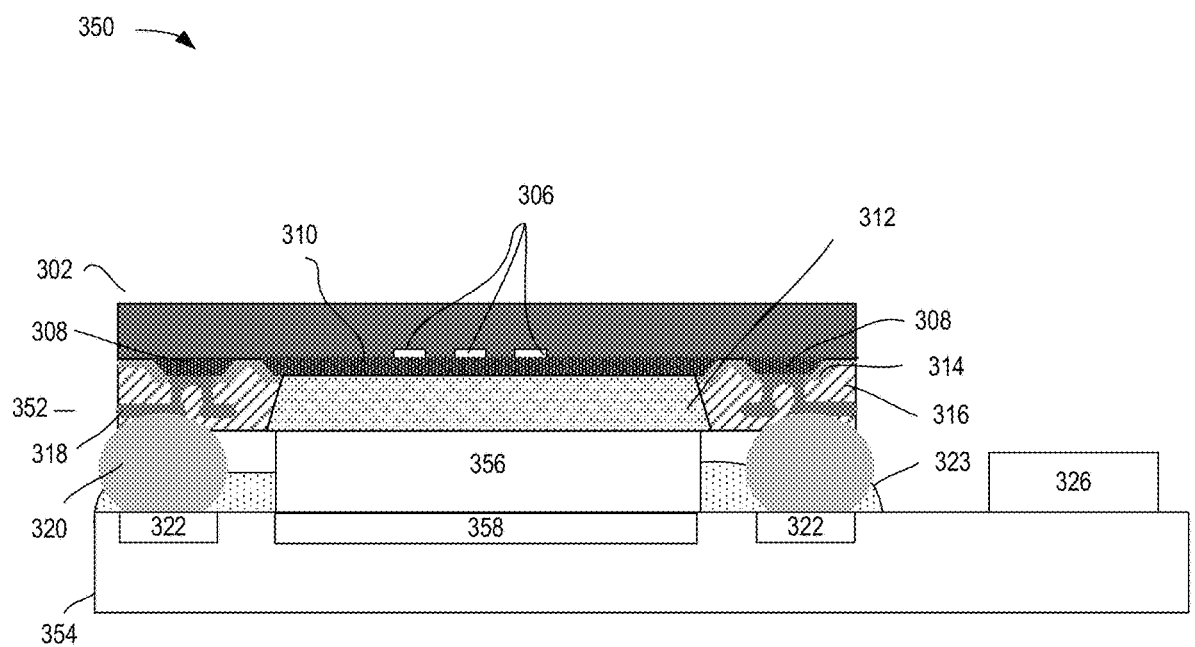

FIGS. 3A & 3B illustrate cross-sectional views of systems including a package with improved thermals, according to some embodiments. As shown in FIG. 3A, system 300 includes die 302, package substrate 304, system board 305, hot spot regions 306, electrical metal pads 308, thermal metal pads 310, thermal regions 312, passivation material 314, dielectric 316, metal routing 318, conductive contacts 320, board pads 322, underfill 323, board thermal region 324, and component 326. Package substrate 304 may include aspects of example package substrates previously presented. As shown, package substrate 304 may include separate thermal metal pads 310 and thermal regions 312 to thermally conduct heat from each hot spot region 306. While shown as including three thermal metal pads 310 and three thermal regions 312, in some embodiments package substrate 304 may include any matched or unmatched number of thermal metal pads and thermal regions.

Package substrate 304 may couple with system board 305 through any known method including, but not limited to soldering. In some embodiments, each conductive contact 320 is coupled with a board pad 322. In some embodiments, underfill 323 may be a thermally conductive material to further spread heat away from die 302.

System board 305 may be a printed circuit board of any number of layers. In some embodiments, system board 305 includes a board thermal region 324, which may be an embedded plane of metal or other thermally conductive material that is coupled with one or more thermal regions 312 through one or more board pads 322. In other embodiments, board thermal region 324 may represent an external thermal solution coupled with one or more board pads 322

System board 305 may include one or more components 326, including, but not limited to, processors, controllers, sensors, memory devices, passive devices, etc, which may be coupled with die 302 through electrical routing (not shown).

FIG. 3B shows system 350, which may include features previously described in reference to other embodiments. In some embodiments, package substrate 352 may include conductive adhesive 356, which may represent an epoxy adhesive with thermally conductive fillers, coupled with thermal region 312 as opposed to one or more conductive contacts 320. Additionally, system board 354 may include board thermal pad 358, which may be the same or different material as board pads 322, to bond with conductive adhesive 356.

Figure 4:
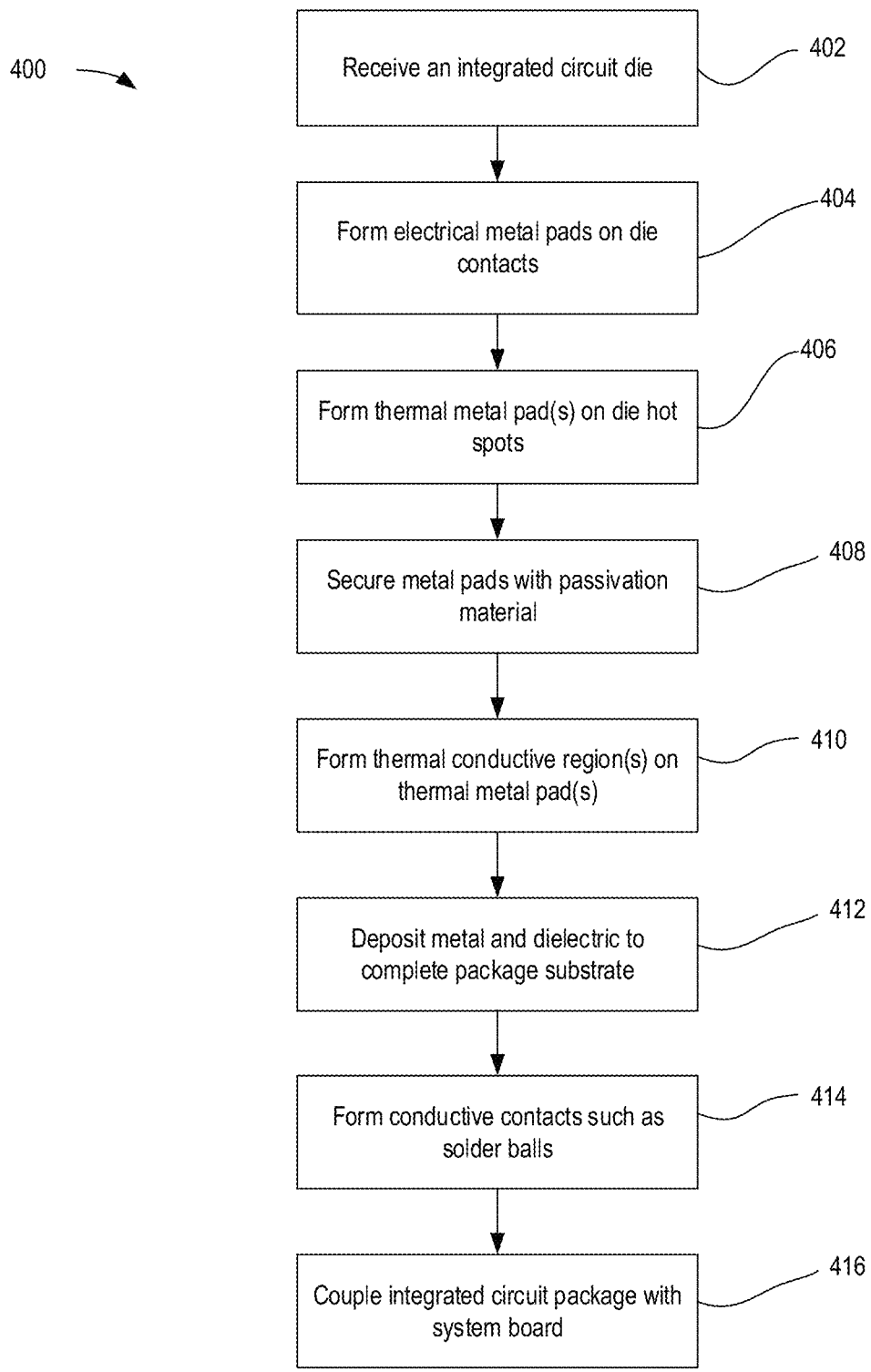
FIG. 4 illustrates a flowchart of a method of forming a package with improved thermals, in accordance with some embodiments.

FIG. 4 illustrates a flowchart of a method of forming a package with improved thermals, in accordance with some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 400 begins with receiving (402) an integrated circuit die. In some embodiments, die 100 may be a power amplifier or similar high power density device with particular hot spot areas. In some embodiments, transistor regions may be located relatively centrally on a die surface relative to electrical contact pads. Next, electrical metal pads are formed (404) on die contacts. In some embodiments, electrical metal pads 208 are formed on contact pads 106. In some embodiments, contact pads 106 may be located near a periphery of a die surface relative to hot spot regions.

Then, one or more thermal metal pads may be formed (406) on die hot spots. In some embodiments, a single thermal metal pad may be formed over a central region of a die surface, thereby coupling with multiple hot spot regions. In some embodiments, separate thermal metal pads are formed over separate hot spot regions of a die surface. Next, the metal pads may be secured (408) with passivation material. In some embodiments, passivation material 214 may be an organic or inorganic dielectric.

The method continues with forming (410) one or more thermal conductive regions on the thermal metal pad(s). In some embodiments, thermal conductive regions 312 are metal or thermally conductive paste. Next, metal and dielectric is deposited (412) to complete a package substrate. In some embodiments, dielectric 316 and metal routing 318 may be iteratively formed in stages using any known additive or semi-additive processes.

Then conductive contacts, such as solder balls, may be formed (414). In some embodiments, conductive adhesive may be used as a conductive contact for thermal regions while more traditional conductive contacts may be used for signal routing. Finally, the integrated circuit package may be coupled (416) with a system board. In some embodiments, soldering, for example wave soldering, may couple the integrated circuit device package with a printed circuit board. In some embodiments, thermally conductive or non-conductive underfill material is utilized.

Figure 5:
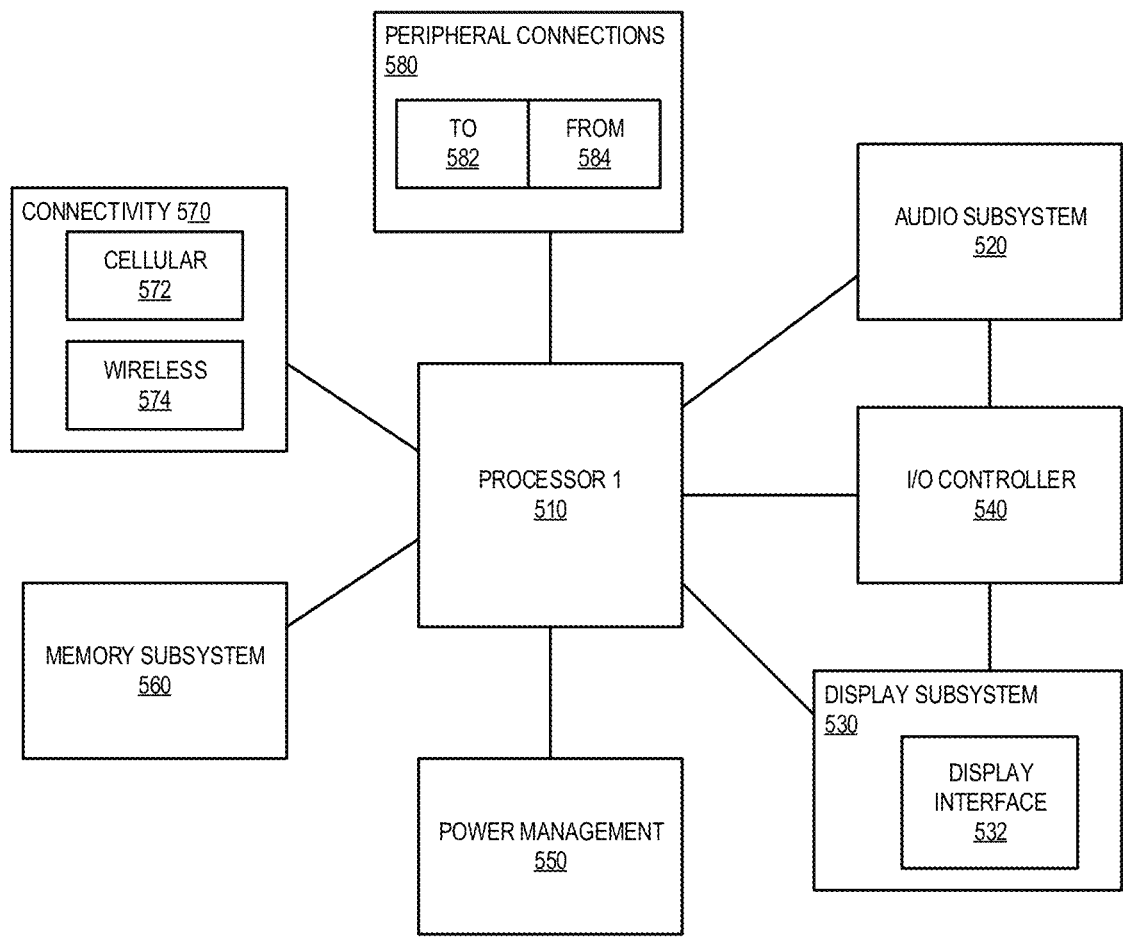
FIG. 5 illustrates a smart device or a computer system or a SoC (System-on-Chip) which includes a package with improved thermals, according to some embodiments.

FIG. 5 illustrates a smart device or a computer system or a SoC (System-on-Chip) 500 which includes a package with improved thermals, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example processor 510 and/or connectivity 570, include a package with improved thermals as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first set of one or more metal pads on a first substrate surface, the first set of one or more metal pads to couple with contacts of an integrated circuit die;

a second set of one or more metal pads on the first substrate surface, the second set of one or more metal pads in direct contact with semiconductor surfaces of the integrated circuit die, wherein the second set of one or more metal pads comprise two or more metal pads separated by the dielectric material;

one or more thermal regions below the first substrate surface, wherein the one or more thermal regions comprise thermally conductive material and are coupled with the second set of one or more metal pads;

dielectric material adjacent the one or more thermal regions; and one or more conductive contacts on a second substrate surface, opposite the first substrate surface, the one or more conductive contacts coupled with the first set of one or more metal pads, and the one or more conductive contacts to couple with contacts of a printed circuit board.

2. The apparatus of claim 1, further comprising a second set of one or more conductive contacts on the second substrate surface, the second set of one or more conductive contacts coupled with the second set of one or more metal pads, and the second set of one or more conductive contacts to couple with contacts of a printed circuit board.

3. The apparatus of claim 2, wherein the second set of one or more conductive contacts comprise solder balls.

4. The apparatus of claim 2, wherein the second set of one or more conductive contacts comprise adhesive comprising metal.

5. The apparatus of claim 1, wherein the one or more thermal regions comprise a paste comprising metal.

6. The apparatus of claim 1, wherein the second set of one or more metal pads comprises copper.

7. The apparatus of claim 1, wherein the second set of one or more metal pads comprise a relatively central portion of the first substrate surface compared to the first set of one or more metal pads.

8. An integrated circuit device package comprising:
a die; and
a package substrate coupled with the die, wherein the package substrate comprises:
a first set of one or more metal pads on a first substrate surface, the first set of one or more metal pads coupled with contacts of the die;
a second set of one or more metal pads on the first substrate surface, the second set of one or more metal pads in direct contact with semiconductor surfaces of the die, wherein the second set of one or more metal pads comprise two or more metal pads separated by the dielectric material;
one or more thermal regions below the first substrate surface, wherein the one or more thermal regions comprise thermally conductive material and are coupled with the second set of one or more metal pads;
dielectric material adjacent the one or more thermal regions; and
one or more conductive contacts on a second substrate surface, opposite the first substrate surface, the one or more conductive contacts coupled with the first set of one or more metal pads, and the one or more conductive contacts to couple with contacts of a printed circuit board.

9. The integrated circuit device package of claim 8, further comprising a second set of one or more conductive contacts on the second substrate surface, the second set of one or more conductive contacts coupled with the second set of one or more metal pads, and the second set of one or more conductive contacts to couple with contacts of a printed circuit board.

10. The integrated circuit device package of claim 9, wherein the second set of one or more conductive contacts comprise solder balls.

11. The integrated circuit device package of claim 9, wherein the second set of one or more conductive contacts comprise adhesive comprising metal.

12. The integrated circuit device package of claim 8, wherein the one or more thermal regions comprise copper.

13. The integrated circuit device package of claim 8, further comprising a second die coupled with the substrate.

14. The integrated circuit device package of claim 8, wherein the second set of one or more metal pads comprise a relatively central portion of the first substrate surface compared to the first set of one or more metal pads.

15. A system comprising:
a printed circuit board;
one or more memory components coupled with the printed circuit board; and
an integrated circuit device package coupled with the printed circuit board, wherein the integrated circuit device package comprises:
a die; and
a package substrate coupled with the die, wherein the package substrate comprises:
a first set of one or more metal pads on a first substrate surface, the first set of one or more metal pads coupled with contacts of the die;
a second set of one or more metal pads on the first substrate surface, the second set of one or more metal pads in direct contact with semiconductor surfaces of the die, wherein the second set of one or more metal pads comprise two or more metal pads separated by the dielectric material;
one or more thermal regions below the first substrate surface, wherein the one or more thermal regions comprise thermally conductive material and are coupled with the second set of one or more metal pads;
dielectric material adjacent the one or more thermal regions; and
one or more conductive contacts on a second substrate surface, opposite the first substrate surface, the one or more conductive contacts coupled with the first set of one or more metal pads, and the one or more conductive contacts coupled with contacts of the printed circuit board.

16. The system of claim 15, further comprising a second set of one or more conductive contacts on the second substrate surface, the second set of one or more conductive contacts coupled with the second set of one or more metal pads, and the second set of one or more conductive contacts coupled with contacts of the printed circuit board.

17. The system of claim 16, wherein the second set of one or more conductive contacts comprise solder balls.

18. The system of claim 16, wherein the second set of one or more conductive contacts comprise high conductivity adhesive.

19. The system of claim 15, wherein the one or more thermal regions comprise a paste comprising metal.

20. The system of claim 15, further comprising a second die coupled with the package substrate.

21. The system of claim 15, wherein the second set of one or more metal pads comprise a relatively central portion of the first substrate surface compared to the first set of one or more metal pads.

22. The system of claim 15, further comprising a thermal region comprising material comprising metal within the printed circuit board coupled with the one or more thermal regions of the package substrate.

* * * * *